United States Patent [19]

Johnston et al.

[11] 3,810,151

[45] May 7, 1974

[54] ANALOGUE TO DIGITAL CONVERTERS

[75] Inventors: James Stewart Johnston; David Frank Fellows, both of Bognor Regis, England

[73] Assignee: Rosemount Engineering Company Limited, Bognor Regis, England

[22] Filed: Aug. 23, 1972

[21] Appl. No.: 283,088

[30] Foreign Application Priority Data

Aug. 26, 1971 Great Britain .................... 40153/71

[52] U.S. Cl. .......................................... 340/347 AD

[51] Int. Cl. .......................................... H03k 13/02

[58] Field of Search................ 340/347 AD, 347 NT

[56] References Cited

UNITED STATES PATENTS

| | | | |
|---|---|---|---|
| 3,521,269 | 7/1970 | Brooks et al. | 340/347 AD |
| 3,201,781 | 8/1965 | Holland | 340/347 AD |
| 3,548,169 | 12/1970 | Togneri | 340/347 AD |
| 3,261,012 | 7/1966 | Bentley | 340/347 AD |
| 3,509,557 | 4/1970 | Groth | 340/347 AD |
| 3,531,800 | 9/1970 | Brescia | 340/347 AD |
| 3,537,102 | 10/1970 | Baratto | 340/347 AD |
| 3,594,783 | 7/1971 | Bullock | 340/347 AD |

*Primary Examiner*—Thomas A. Robinson

*Attorney, Agent, or Firm*—Dugger, Johnson & Westman

[57] ABSTRACT

An analogue-to-digital converter comprises a digital storage means, a digital-to-pulse train converter converting the output of the digital storage means into a pulse train having a frequency representative of the digital number, a comparator comparing the pulse frequency with an analogue input voltage either by converting the pulse frequency into an analogue signal or the analogue input into a pulse frequency, and means responsive to the output of the comparator for periodically updating the number in said digital storage means.

12 Claims, 2 Drawing Figures

ANALOGUE TO DIGITAL CONVERTERS

BACKGROUND OF THE INVENTION

This invention relates to analogue-to-digital converters.

It is well known that the conversion of electrical signals from analogue to digital form requires much more complex apparatus than the conversion from digital to analogue form. Particularly in process or plant control systems or data-logging systems, outputs in digital form may be required from a number of analogue input sources, e.g. transducers. This leads to the possibility of time-sharing of an analogue-to-digital converter with consequent problems of transmission of the analogue inputs from various transducers to the common converter. It is an object of the present invention to provide an improved form of analogue-to-digital converter which, as will be apparent from the following description, can readily be of fairly simple construction thereby making it economically possible in many cases to provide each analogue input source with its own analogue-to-digital converter.

SUMMARY OF THE INVENTION

According to this invention an analogue-to-digital converter comprises storage means for holding a digital output signal, an input circuit to which is applied an input analogue signal, signal conversion means connected to said storage means and/or said input circuit for converting the digital output signal from the storage means and/or the analogue input signal to comparison signals of similar form, a comparator for comparing said comparison signal and providing an output dependent on the sense of the difference between the two comparison signals and means for periodically updating the information in said storage means in accordance with the output of the comparator. By this arrangement, the digital number stored in the storage means is periodically updated to bring the two inputs to the comparator to equality and thus this digital number is brought to the value corresponding to the analogue input.

According to a further aspect of this invention, an analogue-to-digital converter comprises storage means for holding a digital output signal, an input circuit to which is applied an input analogue signal, first signal conversion means connected to said storage means for converting the digital output signal into a pulse train having a frequency dependent on the magnitude represented by said digital output signal, further signal conversion means connected to said first signal conversion means and/or said input circuit for converting the pulse train and/or the analogue input signal to comparison signals of similar form, a comparator comparing said comparison signals and providing an output dependent on the sense of the difference between the two comparison signals and means for updating the information in said storage means in accordance with the output of the comparator.

Conveniently the storage means is a bi-directional counter or a shift register with an adder/subtractor in the re-circulation loop feeding signals from the output of the shift register back to the input. In the latter case, the updating is effected each time the least significant digit is passed through the re-circulation loop. With this arrangement, the updating of the information in the shift register once per cycle ensures that the final reading in the shift register is approached smoothly. The system gives a measure of input smoothing if there should be fluctuations or noise on the analogue input signal.

In one arrangement, the digital signal from the output of the storage means is converted into a pulse frequency and the analogue input voltage is also converted into a pulse frequency using a voltage frequency converter. The comparator is then a frequency comparator. In this case, the frequency comparator may give a digital output signal.

In another arrangement, the digital output is converted into analogue form and an analogue comparator is used for comparing the analogue input with the signal from the digital to analogue converter. The digital-to-analogue conversion may be effected in a number of different ways but conveniently, as is described in the specification of British Pat. No. 1,263,094, the digital number is converted into a pulse train (e.g. as described in the U.S. Pat. Specification No. 3,491,283 of J. S. Johnston entitled "System for Controlling Alternating Current Power in Accordance with a Digital Control Signal" or U.S. Pat. specification No. 3,605,026 of K. R. R. Bowden entitled "Apparatus for providing a pulse train having a mean frequency proportional to a digital number") and the pulse train converted into an analogue signal. The digital signal may for example control the mark-to-space ratio of a train of pulses which can then be integrated to give the analogue signal.

The invention thus includes within its scope an analogue-to-digital converter comprising a storage means for holding a digital output, a digital-to-analogue converter for converting the digital number in the storage means to analogue form, an analogue comparator for comparing the output of the digital-to-analogue converter with an input analogue signal and providing an output of a polarity dependent on the sense of the difference between the two inputs to the comparator and means for periodically updating the information in said storage means in accordance with the output of the comparator. By this arrangement the digital number stored in the storage means is periodically updated to bring the two inputs to the comparator to equality and thus this digital number is brought to the value corresponding to the analogue input.

If the comparator gives an analogue difference signal, the difference signal output from the comparator may be integrated in an integrator which is reset each time the digital number is updated, the output of the integrator being used to update the digital number. For this, latter purpose, conveniently the output of the integrator is applied to both positive and negative polarity triggers, one or other of which will operate according to the integrator output polarity and hence according to the sense of the difference between the two inputs to the comparator. At the next instant when updating is to be effected, e.g. when the least significant digit is present in said adder/subtractor a unit is added or subtracted according to the particular trigger which is operative. Conveniently the outputs of the two triggers are combined in an OR gate and then in an AND gate with the address or timing signal showing when the least significant bit is in the adder/subtractor to provide a reset signal for the integrator. If this reset signal is used as an enabling signal for the adder/subtractor conveniently the output of one trigger is used to add or subtract according to the state of that trigger output when the enabling signal occurs. It will be seen that the rate at which trigger signals are produced will depend on the magnitude of the difference signal from the comparator.

DESCRIPTION OF THE PREFERRED EMBODIMENTS

Figure 1:
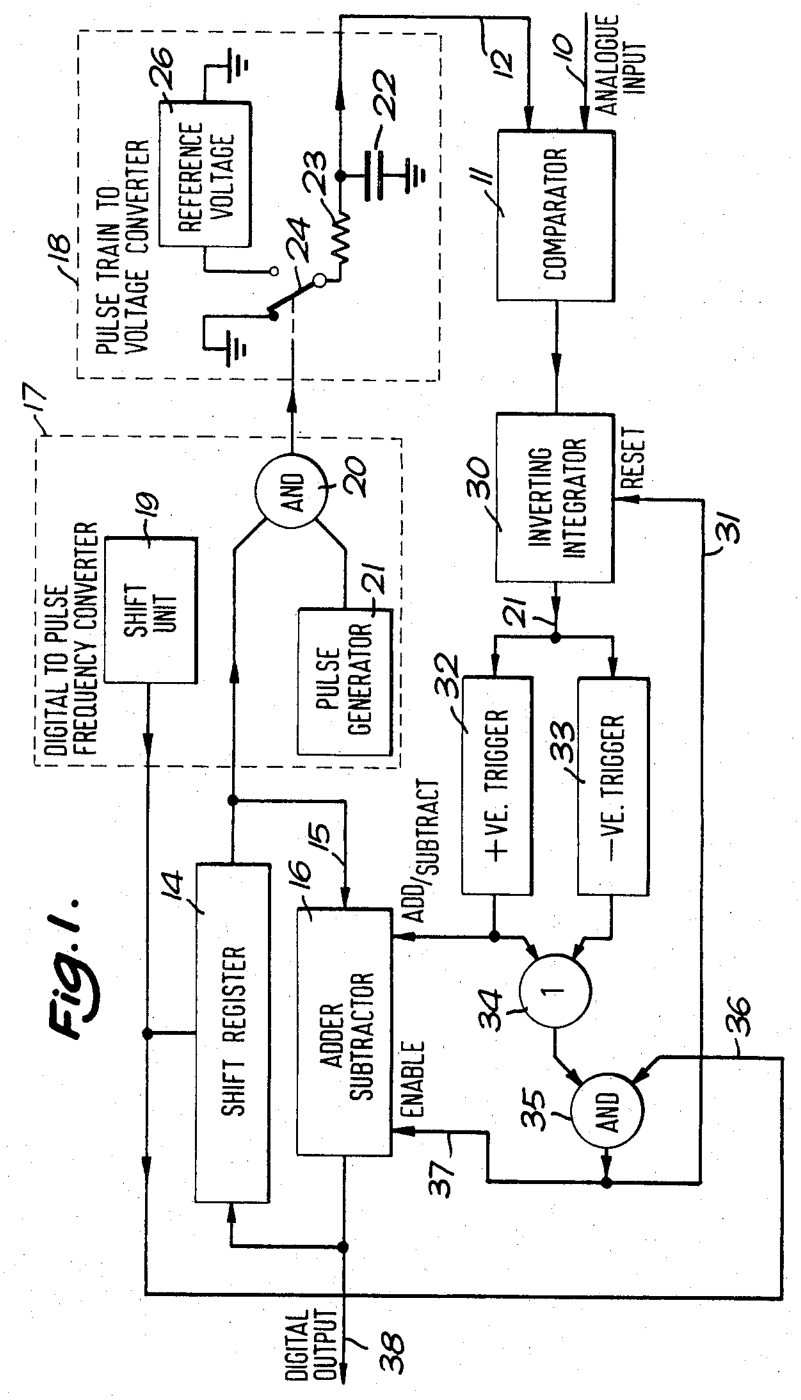
FIGS. 1 and 2 are each diagrams illustrating an analogue-to-digital converter.

Referring to FIG. 1, an input analogue voltage is applied on a lead 10 to an analogue comparator 11 which has a second analogue input on a lead 12. This second input is derived from a digital signal in a memory unit. This might be a bi-directional counter but, in the embodiment illustrated, is a shift register 14 with a recirculation loop 15 including an adder/subtractor 16. The digital signal in the shift register 14 is converted to analogue form by units 17 and 18 and applied to the comparator 11 via lead 12. In this particular embodiment the conversion is effected in two stages. The unit 17 makes use of the successive signals from the shift register, by shifting them at appropriate time intervals according to their significance, to provide a signal having a mark-to-space ratio representing the digital signal. This output is a pulse train having a mean frequency proportional to the digital number. The output of unit 17 is converted into analogue voltage in unit 18. In the unit 17, the shifting of the signals in the shift register is effected by shift unit 19 which steps on the data in the shift register so that each digit remains on the last stage of the shift register 14 for a time duration corresponding to the significance of that digit. This output digit is combined in an AND gate 20 with regularly repetitive pulses from a pulse generator 21. A digital-to-pulse train converter such as the converter 17 is described in the specification of British Pat. No. 1,227,829. Other types of digital to pulse-frequency or digital to mark-space ratio converters are known and may be used. The pulse frequency output from unit 17 is converted to an analogue signal in unit 18 by an averaging circuit. This averaging circuit is illustrated diagrammatically as comprising a shunt capacitor 22 charged through a series resistor 23, the charging voltage being switched by a switch 24 controlled by the pulses from unit 17 so that the resistor 23 is connected to a voltage source 26 and to earth for periods of time corresponding to the mark to space ratio of the pulse train. Such an averaging circuit is more fully described in the specification of British Pat. No. 1,263,094.

The output from the comparator 11 has a polarity depending on the sense of the difference of the two inputs on leads 10, 12. This output is fed to an inverting integrator 30 which is periodically reset by a signal on a lead 31. The integrator gives a sawtooth output of polarity depending on the sense of the input signal, which output is applied to both positive and negative trigger units 32, 33. Depending on the output polarity, one or other of these trigger units will be triggered when the integrator output reaches the trigger reference level. The outputs of the trigger units are fed via an OR gate 34 to one input of an AND gate 35. The second input to this AND gate 35 is a timing signal on a lead 36 from the shift circuit for the shift register 14 indicating when the least significant digit is being circulated through the adder/subtractor 15. The output from the AND gate 35 provides the reset pulse on lead 31 and is also applied on a lead 37 as an enabling pulse to the adder/subtractor 16 so that the latter adds or subtracts one unit according as to whether a signal is present or absent in the output from the positive trigger unit 32. Thus, in each recirculation cycle of the digital data in the shift register, if one of the trigger units 32, 33, has been triggered, the number will be increased or decreased by one. The digital number will remain unchanged if neither trigger unit has been triggered. The digital number is thus changed at a rate and in a sense which will depend on the magnitude and sense of the difference signal from the comparator 11 so as to make the digital number in the shift register correspond to the magnitude of the analogue input on lead 10. The digital output, in this embodiment, is taken out in serial form on a lead 38 from the recirculation loop 15.

Figure 2:
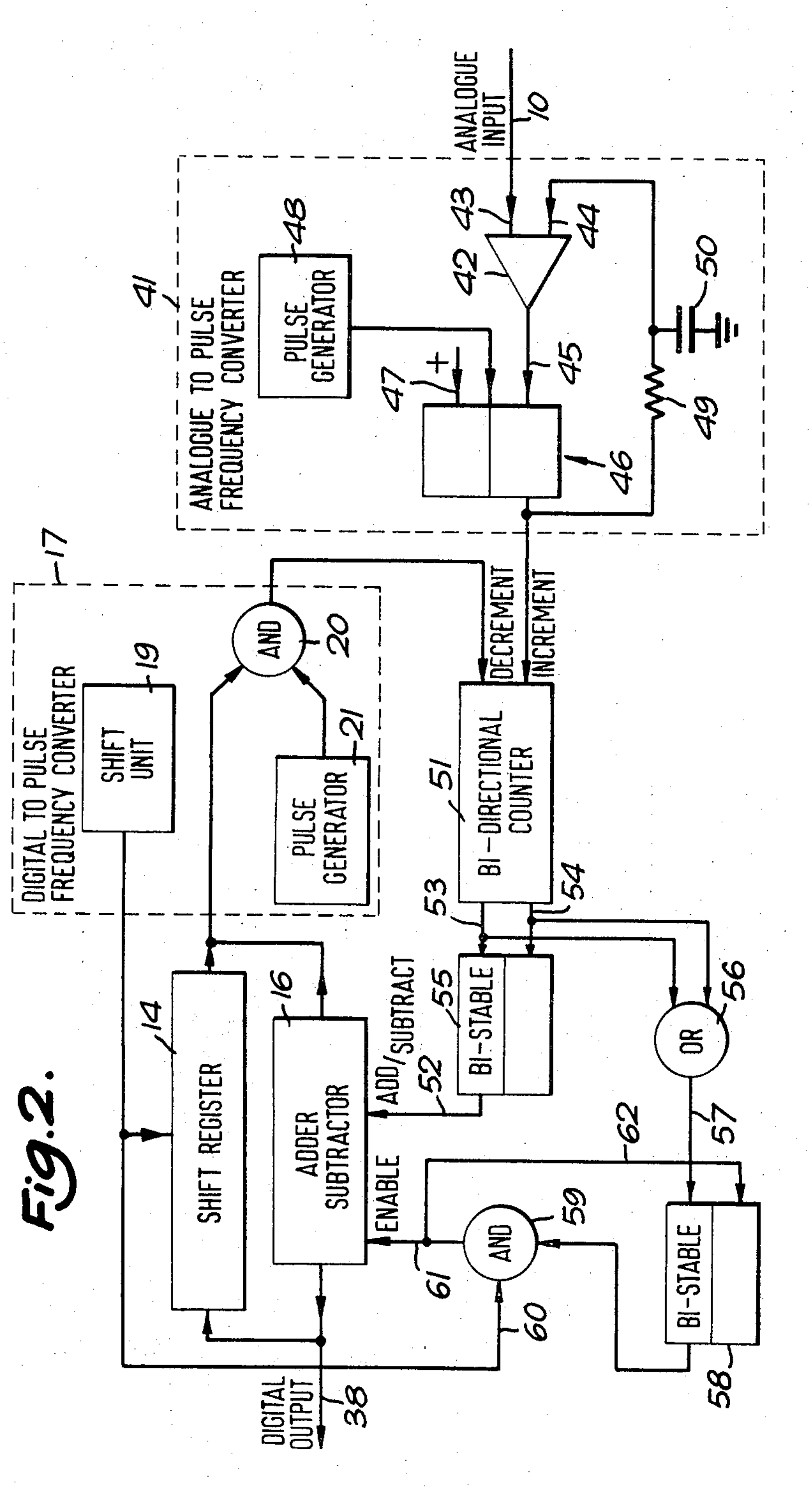

FIG. 2 illustrates a modification of the analogue to digital converter of FIG. 1 in which the output from the shift register is compared with the analogue input by converting both these signals to pulse frequency signals in which the pulse frequency represents the magnitude. In FIG. 2 reference will be made only to the features where the circuit differs from FIG. 1 and corresponding reference numerals are used for corresponding components.

The digital output from the shift register 14 is fed to the digital to frequency converter 17. The analogue input is fed to an analogue to frequency converter 41. The two converters provide output pulse trains each having a frequency representative of the magnitude of the respective input.

The converter 41 is illustrated diagrammatically as comprising a difference amplifier 42, which may be a d.c. or chopper type amplifier. The amplifier has one input 43 to which is applied the analogue input signal and another input 44 to which is applied a feedback signal. The amplifier produces an output signal which varies in accordance with the difference of the signals on inputs 43, 44. This output is applied to one input 45 of a JK bistable circuit 46 and to the other input 47 is applied a continuous logic 1 signal. A pulse source 48 applies a continuous train of pulses to the clock input line of the bistable. If the output from the difference amplifier corresponds to a logic 1, the bistable gives a series of pulses. If the output from the difference amplifier is zero, the bistable will remain or will switch to and remain at the zero-state. This output from the bistable 46 is applied to a passive integrator comprising resistor 49 and capacitor 50 to give the required feedback from the amplifier 42. Reference may be made to the specification of co-pending U.S. Pat. application No. 165,198 of J. S. Johnston entitled "Signal Processing Circuits" for a further description of this and of the other forms of analogue to pulse frequency converters which may be used as the converter 41.

The outputs from the converters 17 and 41 are applied respectively to the decrementing and incrementing inputs of a bidirectional counter 51, which may have only a few stages; this bidirectional counter 51 gives an output on lines 53, 54 dependent on the difference of the pulse frequencies of its two inputs corresponding respectively to whether subtraction or addition in the adder/subtractor 16 is required. The outputs on these lines 53, 54 are applied to a bistable 55 which provides an output on line 52 if subtraction is required to instruct the adder/subtractor 16 to execute subtraction at the next appropriate time. The lines 53, 54 are also connected to an OR gate 56 so that a pulse on either of these lines gives an output on a lead 57 to the "set" input of a bistable 58. When set, the bistable 58 opens an AND gate 59 at the next appropriate shift pulse on lead 60 and so applies an enabling pulse on lead 61 to the adder/subtractor 16. This pulse on lead 61 also via lead 62 resets the bistable 58 so that no further "enable" instructions are passed to the adder/subtractor 16 unless further pulses appear either on line 53 or line 54. It will be seen that the number in the shift register 14 will be incremented or decremented each time a pulse appears on line 54 or line 53 but, if no such pulse appears, then the number in the shift register 14 will remain unchanged.

The bidirectional counter 51 ensures that the shift register 14 does not hunt backwards or forwards unnecessarily in circumstances in which the mean frequencies on the decrementing and incrementing inputs to the counter 51 are equal but with short term irregularities.

It will be seen that the arrangement of FIG. 2, like that of FIG. 1, ensures that the final quantity in the shift register 17 is approached gradually and gives input smoothing. In both these embodiments, it will be noted that outputs are provided for feeding to the adder/subtractor in the form of pulses on two leads, one for adding and the other for subtracting. The frequency of the pulses is proportional to the magnitude of the difference of the two inputs to the comparator system.

If a bidirectional counter is used instead of a shift register 14, then the digital-to-pulse train converter would have parallel instead of serial input. Such a digital-to-pulse train converter may be constructed in the manner described in U.S. Pat. specification No. 3,552,209 of J. S. Johnston entitled "Liquid Level Indicators." In such a construction, the incrementing input from unit 41 and the decrementing input from unit 17 of FIG. 2 may be fed directly into this bidirectional counter which forms the digital store.

We claim:

1. An analogue-to-digital converter comprising storage means for holding a digital output signal, an input circuit to which is applied an input analogue signal, first signal conversion means connected to said storage means for converting the digital output signal into a pulse train having a frequency dependent on the magnitude represented by said digital output signal, further signal conversion means connected to said first signal conversion means for converting the pulse train signal therefrom to an analogue comparison signal, a comparator connected to said input circuit and said further comparison means to compare said comparison signal with said input analogue signal and providing an output dependent on the sense of the difference between the two comparison signals and means for updating the information in said storage means in accordance with the output of the comparator.

2. An analogue-to-digital converter as claimed in claim 1 wherein the storage means is a bi-directional counter.

3. An analogue-to-digital converter as claimed in claim 1 wherein the storage means is a shift register with an adder/subtractor in the recirculation loop feeding signals from the output of the shift register back to the input.

4. An analogue-to-digital converter as claimed in claim 1 wherein the comparator provides a difference signal output in analogue form and wherein an integrator is provided integrating the difference signal output from the comparator, which integrator includes reset means arranged to reset said integrator each time the digital number is updated, and means applying the output of the integrator to said storage means to update the digital number.

5. An analogue-to-digital converter as claimed in claim 4 wherein positive and negative polarity triggers are provided and wherein the output of the integrator is applied to said triggers as that one or other of them will operate according to the integrator output polarity.

6. An analogue-to-digital converter as claimed in claim 5, wherein there is provided an OR gate in which the outputs of the two triggers are combined and an AND gate wherein the output from the OR gate is combined with an address or timing signal showing that the least significant bit is in the adder/subtractor to provide a reset signal for the integrator.

7. An analogue-to-digital converter as claimed in claim 1 wherein said signal conversion means operate cyclically and wherein said means for updating the information in said storage means is arranged to alter the digital number by single unit for each cycle of the signal conversion and comparison.

8. An analogue-to-digital converter comprising storage means for holding the digital output, a digital-to-pulse-train converter for converting the digital number in the storage means to analogue form, a pulse-train to analogue converter converting the output of the digital-to-pulse-train converter to analogue form, an analogue comparator for comparing the output of the pulse-train to analogue converter with an input analogue signal and providing a pulse output on one or other of two lines according to the sense of the difference between the two inputs to the comparator, the pulse output of the comparator having a pulse frequency proportional to the magnitude of the difference of the two inputs, and means connected to said storage means responsive to the signals on said two lines for periodically updating the information in said storage means in accordance with the output of the comparator whereby the difference between the inputs to the comparator is reduced.

9. An analogue-to-digital converter comprising storage means for holding a digital output signal, an input circuit to which is applied an input analogue signal, first signal conversion means connected to said storage means for converting the digital output signal into a pulse train having a frequency dependent on the magnitude represented by said digital output signal, second signal conversion means connected to said input circuit for converting the analogue input signal to a pulse train having a frequency dependent on the magnitude of said analogue input signal, a comparator connected to said first and said second signal conversion means to compare the frequencies of said pulse trains and to provide an output dependent on the sense of the difference between these frequencies and means for updating the information in said storage means in accordance with the output of the comparator.

10. An analogue-to-digital converter as claimed in claim 9 wherein the storage means is a shift register with an adder/subtractor in the recirculation loop feeding signals from the output of the shift register back to the input.

11. An analogue-to-digital converter as claimed in claim 9 wherein said signal conversion means operate cyclically and wherein said means for updating the information in said storage means is arranged to alter the digital number by single unit for each cycle of the signal conversion and comparison.

12. An analogue-to-digital converter as claimed in claim 9 wherein said comparator is arranged to provide output pulses on one or other of two lines according to the sense of the difference between the two inputs to the comparator, the frequency of the pulses being porportional to the magnitude of the difference.

* * * * *